US007932465B2

(12) United States Patent
Wang et al.

(10) Patent No.: US 7,932,465 B2
(45) Date of Patent: Apr. 26, 2011

(54) PHOTOELECTRIC ELECTRODES CAPABLE OF ABSORBING LIGHT ENERGY, FABRICATION METHODS, AND APPLICATIONS THEREOF

(75) Inventors: Hsuan-Fu Wang, Taipei (TW); Bing-Joe Hwang, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 356 days.

(21) Appl. No.: 12/012,917

(22) Filed: Feb. 5, 2008

(65) Prior Publication Data
US 2009/0071534 A1     Mar. 19, 2009

(30) Foreign Application Priority Data

Sep. 17, 2007 (TW) .................. 96134662 A

(51) Int. Cl.
*H01L 31/0256* (2006.01)
*H01L 31/18* (2006.01)
(52) U.S. Cl. ........ 136/263; 136/243; 136/244; 136/252; 428/82; 427/74; 977/932
(58) Field of Classification Search .............. 136/243, 136/244, 252, 2; 438/82; 427/74; 977/932
See application file for complete search history.

(56) References Cited

U.S. PATENT DOCUMENTS

| 6,627,099 B2 * | 9/2003 | Ono et al. ............. 252/62.2 |
| 6,710,366 B1 * | 3/2004 | Lee et al. .................. 257/14 |
| 6,852,920 B2 | 2/2005 | Sager et al. |
| 6,858,158 B2 * | 2/2005 | Chittibabu et al. ...... 252/183.11 |
| 7,217,956 B2 | 5/2007 | Daniels et al. |
| RE39,967 E * | 1/2008 | Salafsky ................ 136/250 |
| 2004/0126582 A1 * | 7/2004 | Ng et al. ................ 428/403 |
| 2004/0226602 A1 * | 11/2004 | Durr et al. ................ 136/256 |
| 2005/0028862 A1 * | 2/2005 | Miteva et al. ............. 136/263 |
| 2005/0139257 A1 | 6/2005 | Islam et al. |
| 2005/0183767 A1 | 8/2005 | Yu et al. |
| 2006/0162771 A1 * | 7/2006 | Inoue et al. ............. 136/263 |
| 2006/0249201 A1 | 11/2006 | Lawandy |
| 2007/0102040 A1 | 5/2007 | Beckenbaugh et al. |
| 2008/0066802 A1 * | 3/2008 | Reddy ..................... 136/258 |

FOREIGN PATENT DOCUMENTS
TW         I271876       1/2007
* cited by examiner

*Primary Examiner* — Jennifer K. Michener
*Assistant Examiner* — Magali P Slawski
(74) *Attorney, Agent, or Firm* — J.C. Patents

(57) ABSTRACT

A photoelectric electrode capable of absorbing light energy is provided. The photoelectric electrode at least includes a conductive substrate, one or more semiconductor particle-containing film with a polytetrafluoroethylene (PTFE) skeleton.

16 Claims, 8 Drawing Sheets

Optoelectronic performances under different
proportions of PTFE and semiconductor particles

| PTFE/TiO₂ Proportion Wt% | Immersing time in a dye (hrs Hour) | Voltage (V) | Current (mA) |
|---|---|---|---|
| It is uneasy to form a film when the content of PTFE is less than 20% | ---------- | ---------- | ---------- |
| 30/70 | 12 | 0.720 | 1.50 |
| 40/60 | 12 | 0.720 | 1.88 |
| 50/50 | 12 | 0.720 | 2.20 |

Working area 0.70 cm² , Using a common ammeter
Working conditions : AM1.5 100 mW/cm²

FIG. 2

Optoelectronic performance after a multilayer process and of different thickness

| PTFE Thickness ($\mu$m) | Immersing time in a dye (hrs Hour) | Voltage (V) | Current (mA) |
|---|---|---|---|
| 440 | 48 | 0.303 | 0.02 |
| 80 | 48 | 0.660 | 1.30 |
| 40 (20X2) | 48 | 0.690 | 1.40 |
| 20 | 12 | 0.710 | 1.81 |

Working area 0.70 $cm^2$, Using a common ammeter
Working conditions: AM1.5 100 $mW/cm^2$

FIG. 3

PHOTOELECTRIC ELECTRODES CAPABLE OF ABSORBING LIGHT ENERGY, FABRICATION METHODS, AND APPLICATIONS THEREOF

CROSS-REFERENCE TO RELATED APPLICATION

This application claims the priority benefit of Taiwan application serial no. 96134662, filed Sep. 17, 2007. The entirety of each of the above-mentioned patent application is incorporated herein by reference and made a part of this specification.

BACKGROUND OF THE INVENTION

1. Field of the Invention

The present invention relates to a photoelectric electrode capable of absorbing light energy, which at least includes a conductive substrate (an inorganic or organic polymer), one or more semiconductor particle-containing film with a polytetrafluoroethylene (PTFE) skeleton.

The present invention also relates to a hydrogen generation device, which includes a photoelectric electrode capable of absorbing light energy composed of a conductive substrate and one or more semiconductor particle-containing film with a PTFE skeleton, a water tank, and a hydrogen collecting device tank. In the hydrogen generation device, the photoelectric electrode can also be immersed into a sensitizing dye bath to absorb the dye, so as to form a photoelectric electrode capable of absorbing full spectrum light energy, thereby fabricating the hydrogen generation device. The present invention also provides a dye-sensitized solar cell, which includes the photoelectric electrode capable of absorbing full spectrum light energy formed by immersing the photoelectric electrode into a sensitizing dye bath to absorb the dye, an electrolyte, and a counter electrode.

The present invention also provides a non-dye-sensitized solar cell, which is formed by mixing semiconductor nano-particles and PTFE to obtain a film, combining the film with a conductive substrate, and then sintering.

The present invention also provides a polymer film solar cell, which is formed by mixing semiconductor nano-particles, wires, or tubes with PTFE to obtain a film and sintering, then coating the film with a conductive polymer, and combining the film with a conductive substrate.

2. Description of Related Art

A photoelectrode is mainly used for absorbing light radiation and converting it into photovoltage/photocurrent. The electrode includes a transparent conductive substrate, and an absorption layer for converting light energy into photovoltage/photocurrent. The photoelectrode and a counter electrode form an optoelectronic component. The optoelectronic component may be a hydrogen generation device, and various solar cells. As it is necessary to convert the solar energy penetrated to the absorption layer into photovoltage/photocurrent, at least one electrode must be a transparent conductive substrate, but not limited to one electrode, both of the two electrodes can be transparent conductive substrates.

The conventional photoelectric electrodes of solar cells are mainly made of silicon (monocrystalline, polycrystalline, and amorphous silicon). In addition, cadmium sulfide (CdS) photoelectric electrode, cadmium arsenide (CdTe) photoelectric electrode, copper indium gallium diselenide (CIGS) photoelectric electrode, dye-sensitized photoelectric electrode, and organic polymer photoelectric electrode etc. all improve the efficiency of the solar cells continuously.

Currently, the fabrication of the photoelectric electrode mainly includes coating a conductive glass with semiconductor nano-particles; grinding a mixture of semiconductor particles and an adhesive such as polyethylene glycol (PEG), polyethylene (PE), polyethylene oxide (PEO), cellulose, and alkylphenol polyethoxylate non-ion surfactants, and a dispersant such as acetylacetone (AcAc), or ethanol; and knife coating, printing, pyrolysis, or spray coating the mixture on the conductive glass coated with semiconductor nano-particles. However, the fabrication method has disadvantages that the thickness is not easily increased or the film is likely cracked after increasing the thickness, thus deteriorating the efficiency of the electrode. Furthermore, the adhesive and dispersant are used to fabricate the electrode, after sintering at a high temperature (about 500° C.), the adhesive and dispersant are volatilized. The combination between the crystals of the semiconductor might have defects, and thus the structure is fragile, the chemical resistance and durability are poor, and its structural strength is insufficient, which are fatal to the photoelectric electrode requiring durability. For the usages of the photoelectric electrode, the energy band of the semiconductor crystal is always required to be modified, so as to improve the efficiency of the electrode. Therefore, it is very necessary to perform a multilayer processing. However, it is very difficult to perform the multilayer processing due to the insufficient structural strength. The problems and the disadvantages can be alleviated in the present invention.

SUMMARY OF THE INVENTION

Accordingly, the present invention is directed to a photoelectric electrode capable of absorbing light energy, which at least includes a conductive substrate, one or more semiconductor particle-containing film with a PTFE skeleton. A semiconductor particle slurry layer is further disposed between the substrate and the film containing semiconductor particles and PTFE. The size of the particles of the semiconductor particle slurry layer can be 2 nm-1,000,000 nm, generally 2 nm-100,000 nm, and preferably 2 nm-1000 nm. The smaller the semiconductor particles are, the more transparent the film is, so the most appropriate size of the particles is 5 nm-30 nm. The semiconductor particles of the semiconductor particle slurry layer and the semiconductor particles in the film with the PTFE skeleton can be the same or different, which is not specially limited in the present invention.

In the photoelectric electrode capable of absorbing light energy of the present invention, the photoelectric electrode capable of absorbing light energy is optionally immersed into a sensitizing dye to become a photoelectric electrode capable of absorbing full spectrum light energy.

A method (I) of fabricating a photoelectric electrode capable of absorbing light energy of the present invention includes combining a conductive substrate and a film containing a mixture of semiconductor particles and PTFE, before the film is formed. The film is formed by coating, knife coating, extruding, rolling, or die casting. At this time, a multilayer processing can be performed to coat the semiconductor particle slurry and/or the mixture of semiconductor particles and PTFE on the film, and the film is then combined with the substrate. After being sintered at about 500° C., the photoelectric electrode capable of absorbing light energy is thus formed. In this method, a multilayer processing can be optionally performed according to desired thickness.

A method (II) of fabricating a photoelectric electrode capable of absorbing light energy of the present invention includes: mixing semiconductor particles and PTFE to form a film by coating, knife coating, extruding, rolling, or die casting; next, coating the film with the semiconductor particle slurry, and combining the film with the conductive substrate. Alternatively, after coating the semiconductor particle slurry on a conductive substrate, the conductive substrate is then combined with the film of the mixture of semiconductor particles and PTFE, and the combination is sintered at about 500° C. to form the photoelectric electrode capable of absorbing light energy. A semiconductor particle slurry layer can also be coated on the conductive substrate, and dried at about 80° C. and sintered at about 500° C. Semiconductor particles and PTFE are mixed to form a film by coating, knife coating, extruding, rolling, or die casting. The film is coated by the semiconductor particle slurry, and then combined with the transparent conductive substrate. In this method, a multilayer processing can be optionally performed according to desired thickness.

The sintering step in the fabrication methods (I) and (II) is not limited and can be performed for one time or multiple times according to the requirements of the production. When the sintering step is performed for multiple times, it is preferred to be performed for 2-3 times. The sintering temperature is about 200° C.-700° C., and preferably about 300° C.-550° C.

In the photoelectric electrode of the present invention, the conductive substrate is formed by coating a conductive layer on any (transparent or opaque depending on the usage) substrate. The substrate can be an inorganic or organic, transparent or opaque substrate, for example, rigid transparent or opaque materials such as glass, poly-methylmethacrylate (PMMA), polyethylene (PE), poly(ethylene terephthalate) (PET), and polycarbonate. For example, a glass coated with indium-tin-oxide (ITO), a glass coated with fluorine-doped tin oxide (FTO), ITO doped with antimony tin oxide (ATO) can also be used. The substrate can also be a flexible organic transparent or opaque soft substrate, constituted by any transparent polymer material, for example, polyolefin, polyethylene (PE), polypropylene (PP), polyester, PET, PMMA, polycarbonate, and preferably polyester, PET, and polycarbonate. The substrate can also be the transparent or opaque substrate provided in patents US20070102040, U.S. Pat. No. 7,217,956 etc. The thickness of the substrate is not specially limited, generally 5 μm-10,000 μm, and preferably 20 μm-2,000 μm.

In the photoelectric electrode of the present invention, the semiconductor particle can be any type of composite nanoparticle selected from among titanium dioxide, zinc oxide, tin oxide, iron oxide, tungsten oxide, silicon carbide, cadmium sulfide, cadmium selenide, gallium phosphide, gallium arsenide, cadmium telluride, copper indium gallium diselenide or copper indium, indium gallium, copper gallium, copper indium gallium, copper indium gallium selenium sulfide and/or mixtures and modified mixtures thereof. The semiconductor particle can also be the semiconductor particles disclosed in patents US20050183767, US20070102040 etc. The average particle diameter is generally 2 nm-1,000,000 nm, and preferably 2 nm-100,000 nm.

In the photoelectric electrode of the present invention, PTFE can be liquid, if in a state of suspending in water, the content of PTFE is 16 wt %-90 wt % (relative to the total weight of the suspension in water), and most preferably 30 wt %-70 wt %. Further, PTFE can also be in a solution state of powder particles dissolved in an appropriate solvent. Further, PTFE can also be in a melted liquid state. The semiconductor particles can be uniformly dispersed by dispersant or other methods.

In the photoelectric electrode of the present invention, the content of the semiconductor particles in the mixture of the semiconductor particles and PTFE is 10 wt %-90 wt % (relative to the total weight of the semiconductor particles and PTFE), preferably 30 wt %-70 wt %, and most preferably 40 wt %-60 wt %. If the content of the semiconductor particles is low (less than 50 wt %), a semiconductor slurry layer is preferably coated between the transparent or opaque conductive substrate and the film containing the semiconductor particles and PTFE.

In the photoelectric electrode of the present invention, the photosensitizing dye can be a conventional photosensitizing dye, as long as the dye is capable of being combined with the semiconductor particles. The dye includes natural dyes such as chlorophyll, lutein, lycopene, anthocyanin, flavonoid, carotene, capsanthin. The dye also includes synthesized dyes, for example, the dyes mentioned in patent US20050139257, in which the ruthenium-containing dye has better effects, such as N3, N719, black dye (from Solaronix Company, Switzerland); and sensitizing dyes disclosed in patents US20060249201, US20050139257.

In the photoelectric electrode of the present invention, the method of forming the film is not specially limited, and includes, for example, spin coating, knife coating, spray coating, extruding, rolling, or die casting.

The present invention further provides a hydrogen generation device, which includes the photoelectric electrode capable of absorbing light energy of the present invention, a counter electrode, a water tank, and a hydrogen collecting tank. As described above, the photoelectric electrode includes a transparent or opaque conductive substrate, one or more semiconductor nano-particle-containing film with a PTFE skeleton, thus forming a photoelectric electrode capable of absorbing light energy. A semiconductor particle slurry layer is additionally disposed between a substrate and the film containing semiconductor particles and PTFE. A multi-layered photoelectric electrode formed by the multilayer processing can further be included.

In the hydrogen generation device of the present invention, the semiconductor nano-particle is selected from among titanium dioxide, zinc oxide, tin oxide, iron oxide, tungsten oxide, silicon carbide, cadmium sulfide, cadmium selenide, gallium phosphide, gallium arsenide, cadmium telluride, copper indium gallium diselenide or copper indium, indium gallium, copper gallium, copper indium gallium, copper indium gallium selenium sulfide and/or mixtures and modified mixtures thereof.

When the semiconductor nano-particle is selected from among titanium dioxide, zinc oxide, tin oxide, iron oxide, tungsten oxide, silicon carbide, cadmium sulfide, cadmium selenide, gallium phosphide, gallium arsenide, and mixtures and modified mixtures thereof, the formed photoelectric electrode is suitable for absorbing UV or other light energy having a longer or shorter wavelength. The photoelectric electrode can also be sintered, and then immersed into a sensitizing dye bath to absorb the dye, so as to form a photoelectricelectrode capable of absorbing full spectrum light energy, for fabricating the hydrogen generation device.

In the hydrogen generation device of the present invention, the material of the conductive substrate is the same as that of the conductive substrate in the photoelectric electrode as described above.

In the hydrogen generation device of the present invention, the material of the photosensitizing dye is the same as that of the photosensitizing dye in the photoelectric electrode as described above.

The present invention further provides a dye-sensitized solar cell, which includes the photoelectric electrode capable of absorbing full spectrum light energy, an electrolyte, and a counter electrode.

In the dye-sensitized solar cell of the present invention, the electrolyte is not specially limited and can be a common conventional electrolyte, and preferably an iodine ion ($I^-$/$I^{3-}$)-containing electrolyte.

In the dye-sensitized solar cell of the present invention, the electrode is not specially limited and can be a common conventional electrode, and preferably a platinum electrode, so as to get high efficiency.

The present invention further provides a non-dye-sensitized solar cell, which is formed by mixing semiconductor nano-particles and PTFE into a film, and then combining the film with a conductive substrate and sintering, thereby forming a film solar cell. The sintering process is not limited to follow the combination with the substrate, instead, it can be performed before combining or performed for several time before combining, and there are many combinations. The semiconductor nano-particle is the same as the semiconductor nano-particle in the photoelectric electrode as described above, and is preferably selected from among cadmium arsenide (GaAs), cadmium arsenide (CdTe), copper indium gallium diselenide (CIGS) or copper indium, indium gallium, copper gallium, copper indium gallium, copper indium gallium sulfide and/or composites thereof.

The present invention further provides a polymer film solar cell, which is formed by mixing semiconductor nano-particles, wires or tubes and PTFE into a film, and sintering the film; coating a conductive polymer on the film, and then combing the film with a conductive substrate. The conductive polymer is not limited to polyethylene-dioxythiophene (PEDOT), polythiophene, polypyrrole, polyaniline, and can include various conductive polymers or conductive polymers of a mixture of common polymer and inorganic or metal conductive nano-particles. The conductive polymers disclosed in patents TWI271876, U.S. Pat. No. 6,852,920 can also be used as the conductive polymer of the present invention. The semiconductor nano-particle is the same as the semiconductor nano-particle in the photoelectric electrode as described as above, and is preferably selected from among C-60, cadmium sulfide (CdS), cadmium arsenide (CdTe) and titanium dioxide (TiO2).

The present invention is mainly characterized by the photoelectric electrode formed by a semiconductor particle-containing film with a PTFE skeleton, and the present invention has the following advantages.

1. The film is soft and is used to fabricate flexible photoelectric electrodes.
2. PTFE has good chemical resistance, thus improving the lifetime of the photoelectric electrode.
3. With PTFE as the skeleton of the film, high intensity and high porosity can be provided.
4. A multilayer processing of the electrode is provided.
5. PTFE has critical influence on the improvement of the efficiency and the fabrication of the photoelectric electrode.
6. The thickness is easily increased, and the film is not easily cracked after increasing the thickness.
7. The semiconductor particle slurry is easily adhered on the film containing semiconductor particles and PTFE film tightly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 shows photoelectrical performances of different proportions of semiconductor particles to PTFE, when the proportion of the semiconductor particles to PTFE is 50% to 50%, the photoelectric electrode exhibits the best performance.

FIG. 3 shows during a multilayer processing, the thickness of PTFE can be easily increased and controlled, when having a thickness of about 20 µm, the photoelectric electrode has a better photoelectric performance.

DESCRIPTION OF THE EMBODIMENTS

Figure 1:
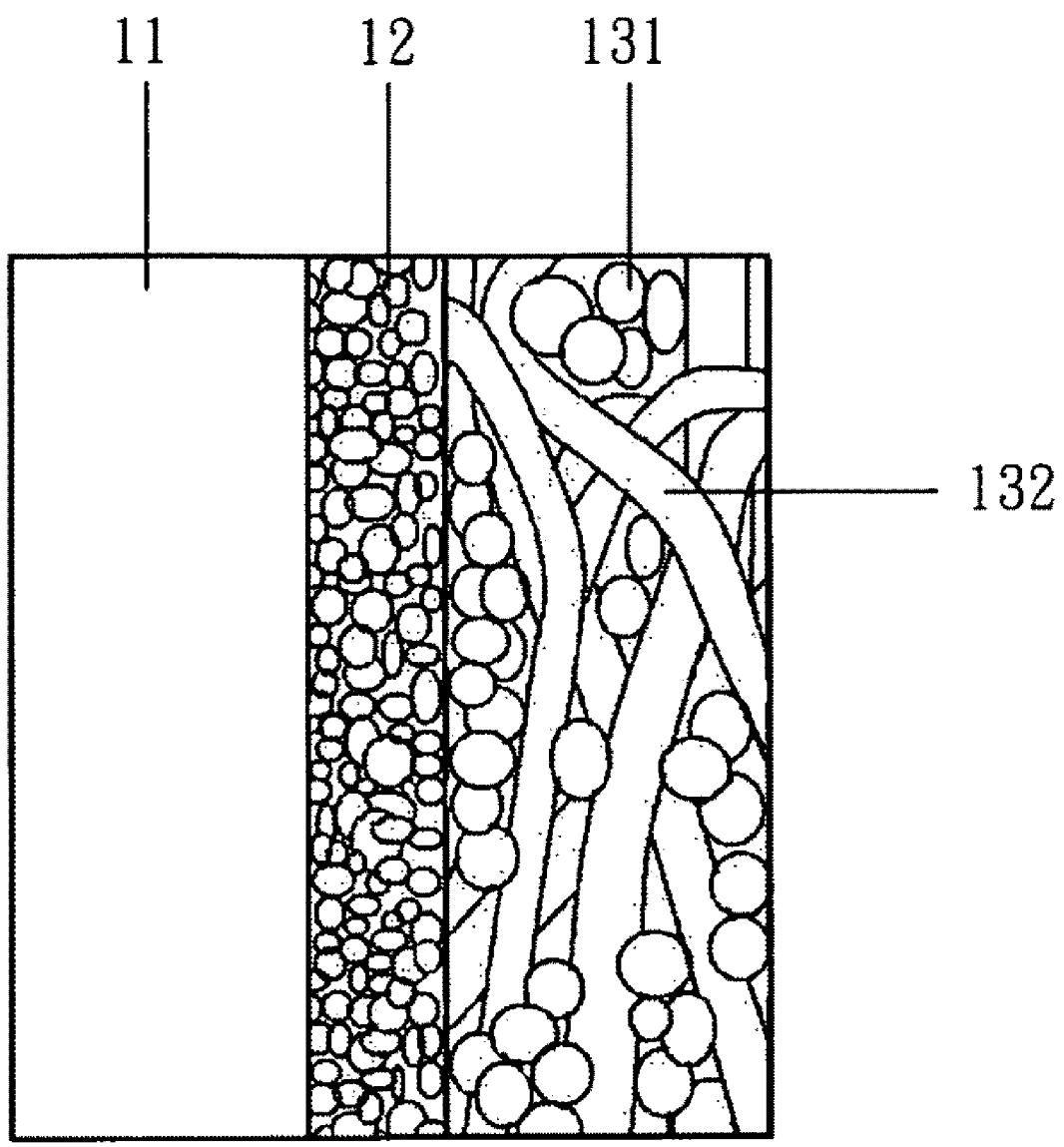
FIG. 1 is a schematic structural view of a photoelectric electrode of the present invention.

Reference will now be made in detail to the present preferred embodiments of the invention, examples of which are illustrated in the accompanying drawings. Wherever possible, the same reference numbers are used in the drawings and the description to refer to the same or like parts.

It is notable that the following embodiments are used to illustrate, but not to limit, the present invention.

Fabrication Methods of a Photoelectric Electrode

The photoelectric electrode of the present invention includes a conductive substrate, at least one or more semiconductor particle-containing film with a PTFE skeleton, thus forming a photoelectric electrode capable of absorbing light energy.

Fabrication Method (I)

A PTFE mixture of high-content semiconductor particles is die-cast into a film, at this time, excessive semiconductor particles are precipitated from a surface of the film, and then the film is combined with a transparent conductive substrate and sintered at 500° C. for 30 min, thereby forming a photoelectric electrode capable of absorbing light energy.

Fabrication Method (II)

A semiconductor particle slurry layer is coated on a conductive substrate, dried at 80° C. for 10 min, and sintered at 500° C. for 30 min. Semiconductor particles and PTFE are mixed and die-cast into a film, and then the film is coated with a semiconductor particle slurry, combined with the above substrate, and then sintered at 500° C. for 30 min, thereby forming a photoelectric electrode capable of absorbing light energy.

Fabrication Method (III)

Semiconductor particles and PTFE are mixed and die-cast into a film, the film is coated with a semiconductor particle slurry, combined with a conductive substrate, and then sintered at 500° C. for 30 min, thereby forming a photoelectric electrode capable of absorbing light energy.

It is notable that, in the three fabrication methods, a multilayer processing can be performed to form a multi-layered photoelectric electrode with a desired thickness. The sintering process is not limited to follow the combination with the substrate, it can be performed before combination or performed for several time before combination, and there are many potential variations.

Fabrication Method of a Photoelectric Electrode Capable of Absorbing Full Spectrum Light Energy The photoelectric electrode capable of absorbing light energy as described above is immersed into a photosensitizing dye bath to absorb the dye, so as to obtain a photoelectric electrode capable of absorbing full spectrum light energy.

Fabrication Method of a Hydrogen Generation Device

The hydrogen generation device of the present invention includes a photoelectric electrode capable of absorbing light energy composed of a conductive substrate and at least one or more semiconductor particle-containing film with a PTFE skeleton. The hydrogen generation device further includes a counter electrode, a water tank, and a hydrogen collecting device tank. The fabrication methods of the photoelectric electrode or the photoelectric electrode capable of absorbing full spectrum light energy are as described above. Furthermore, the hydrogen generation device is formed by combining the photoelectric electrode capable of absorbing light energy, a counter electrode, a water tank, and a hydrogen collecting device tank.

Fabrication Method of a Dye-Sensitized Solar Cell

A dye-sensitized solar cell is formed by combining the photoelectric electrode capable of absorbing full spectrum light energy, an electrolyte, and a platinum counter electrode.

Fabrication Method of a Non-Dye-Sensitized Film Solar Cell

A non-dye-sensitized solar cell is formed by combining the photoelectric electrode capable of absorbing light energy and a counter electrode. The fabrication method of the photoelectric electrode is as described above without the step of immersing the photoelectric electrode into a photosensitizing dye bath to absorb the dye. The semiconductor nano-particle is preferably selected from among gallium arsenide (GaAs), cadmium arsenide (CdTe), copper indium gallium diselenide (CIGS) or copper indium, indium gallium, copper gallium, copper indium gallium, copper indium gallium sulfide and composites thereof. The semiconductor nano-particles and PTFE are mixed to form a film, and the film is combined with a conductive substrate and sintered to form a non-dye-sensitized solar cell. The sintering process is not limited to follow the combination with the substrate, it can be performed before combination or performed for several time before combination, and there are many potential variations.

Fabrication Method of a Polymer Film Solar Cell

A polymer film solar cell is formed by combining the photoelectric electrode capable of absorbing light energy coated with a conductive polymer and a counter electrode. The semiconductor nano-particle is preferably selected from among nano-particles, wires or tubes of C-60, cadmium sulfide (CdS), cadmium arsenide (CdTe), titanium dioxide (TiO$_2$). The semiconductor nano-particles and PTFE are mixed to form a film, the film is sintered, coated with a conductive polymer such as PEDOT, polythiophene, polypyrrole, polyaniline, and then combined with a conductive substrate to form a polymer film solar cell.

Figure 4:
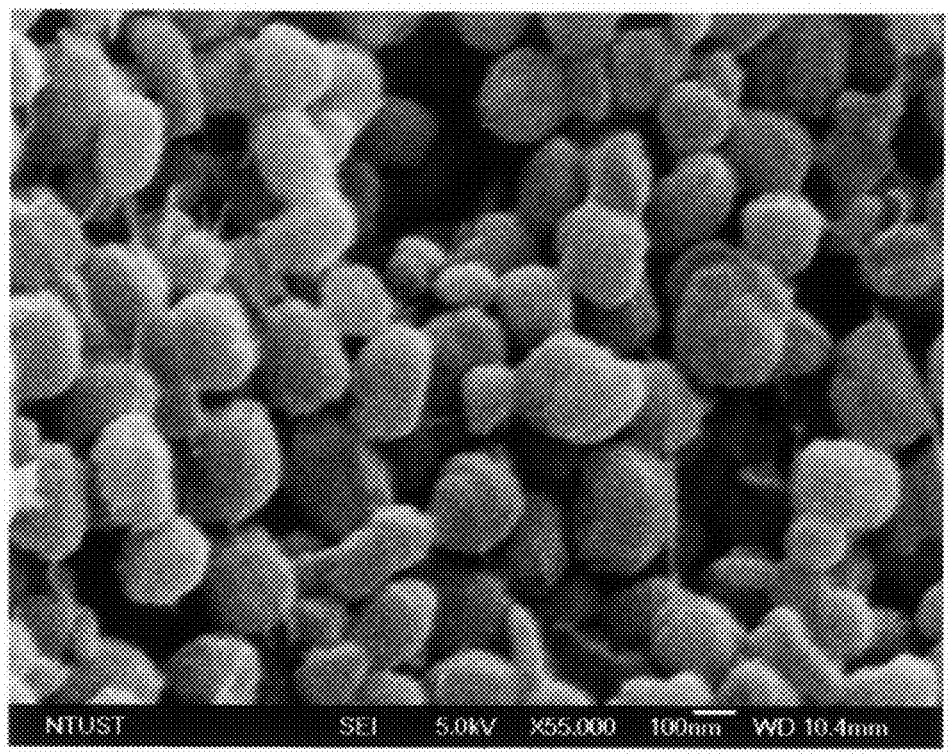
FIG. 4 shows the PTFE are particles in the solution state.
Figure 5:
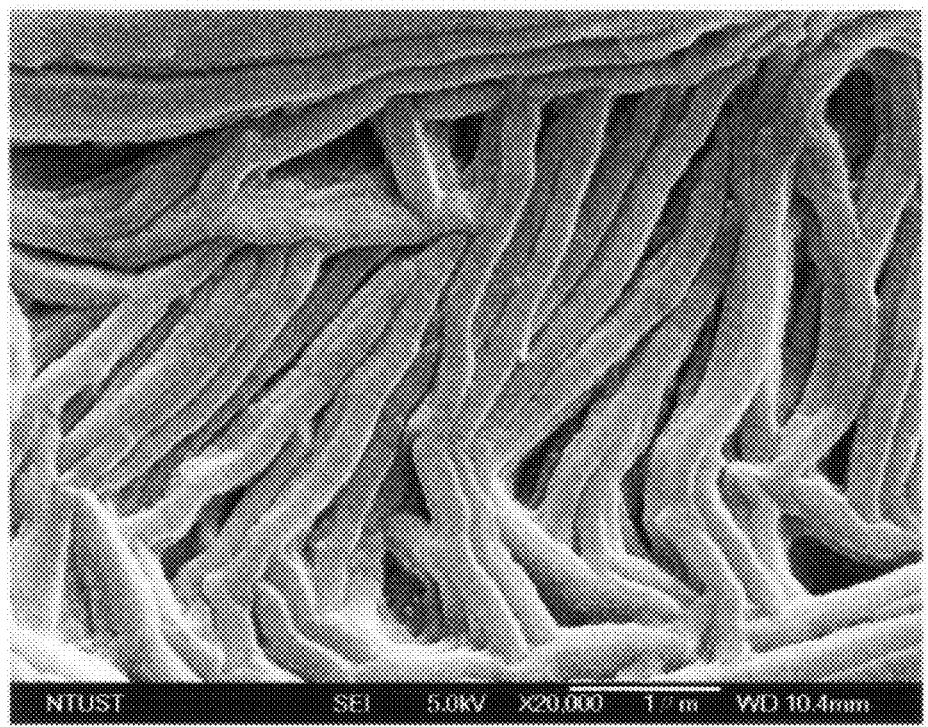
FIG. 5 shows after sintering at a high temperature (400° C.-500° C.), a filiform skeleton is generated.
Figure 6:
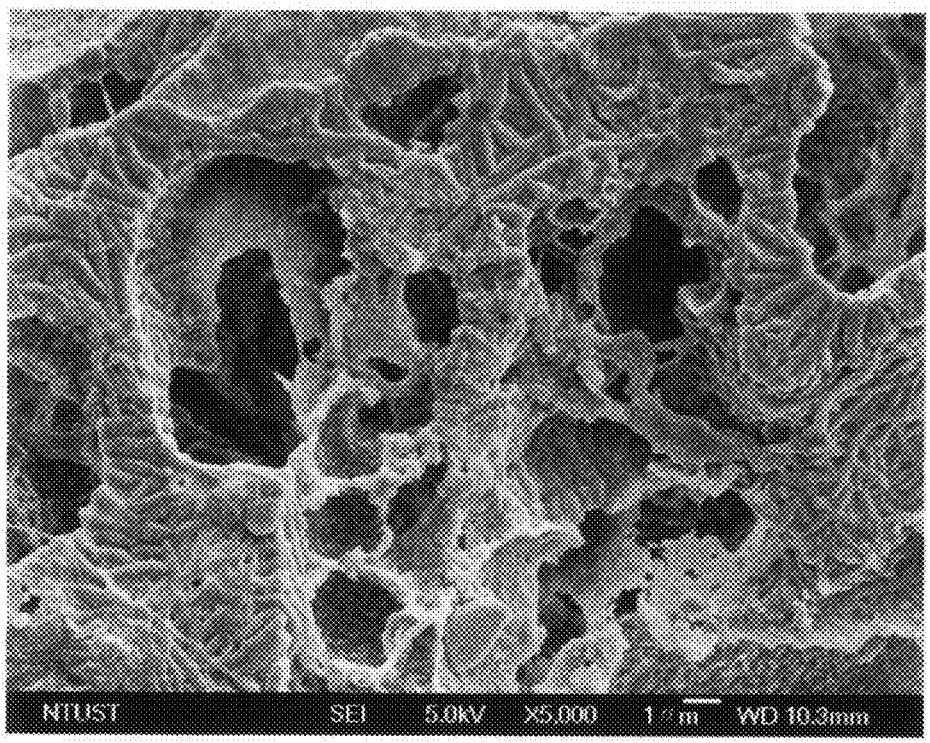
FIG. 6 shows after mixing with semiconductor particles and sintering, many pores are generated.
Figure 7:
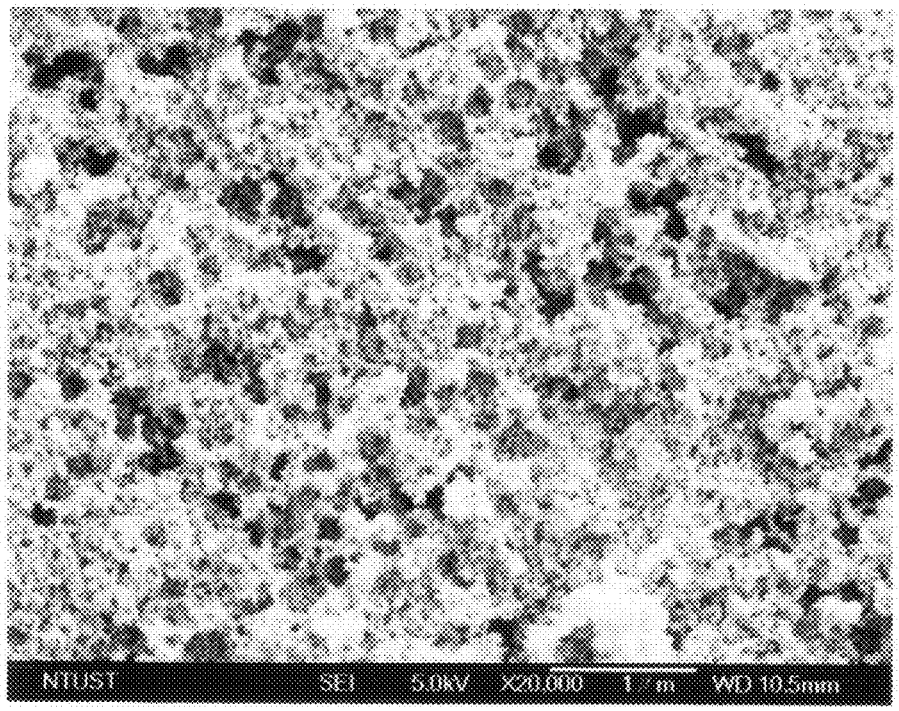
FIG. 7 shows a surface state of a film having high porosity and strong structure can be fabricated.
Figure 8:
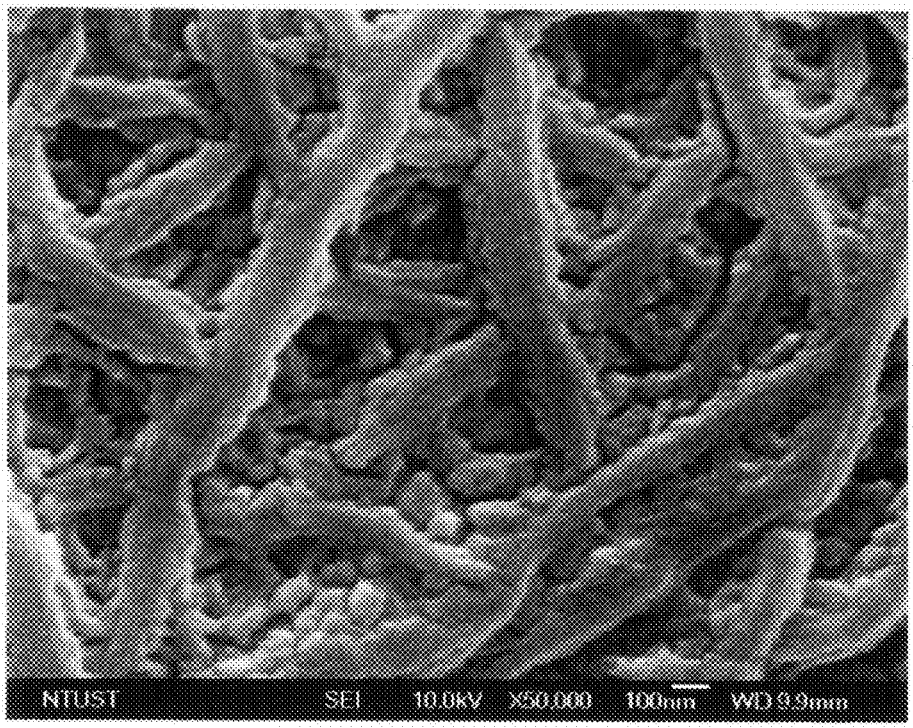
FIG. 8 shows the semiconductor particles can partially enter the PTFE, but the amount is limited, and the rest part are exuded out to form a film.

Finally, for describing the phenomena actually observed during the fabrication process of the present invention, FIG. 1 shows a schematic structural view of a photoelectric electrode of the present invention. PTFE are particles in the solution state, and a liquid solution is used herein. If PTFE is in a powder state or a block state, it must be dissolved in a solvent, as shown in FIG. 4. After sintering at a high temperature (400° C.-500° C.), a filiform skeleton is generated, as shown in FIG. 5. After mixing with semiconductor particles and sintering, many pores are generated, as shown in FIG. 6. The size and number of the pores are controlled by the proportion of the mixture. As PTFE has good chemical resistance, a film having high porosity and strong structure can be fabricated, and the surface state is as shown in FIG. 7. The semiconductor particles can partially enter the PTFE, but the amount is limited, as shown in FIG. 8, and the rest part are exuded out to form a film. As the semiconductor particles are directly combined, a film having a lower internal resistance can be obtained, compared with that formed by combining the semiconductor particles with an adhesive and having a larger internal resistance due to the adhesive thereamong.

Figure 9:
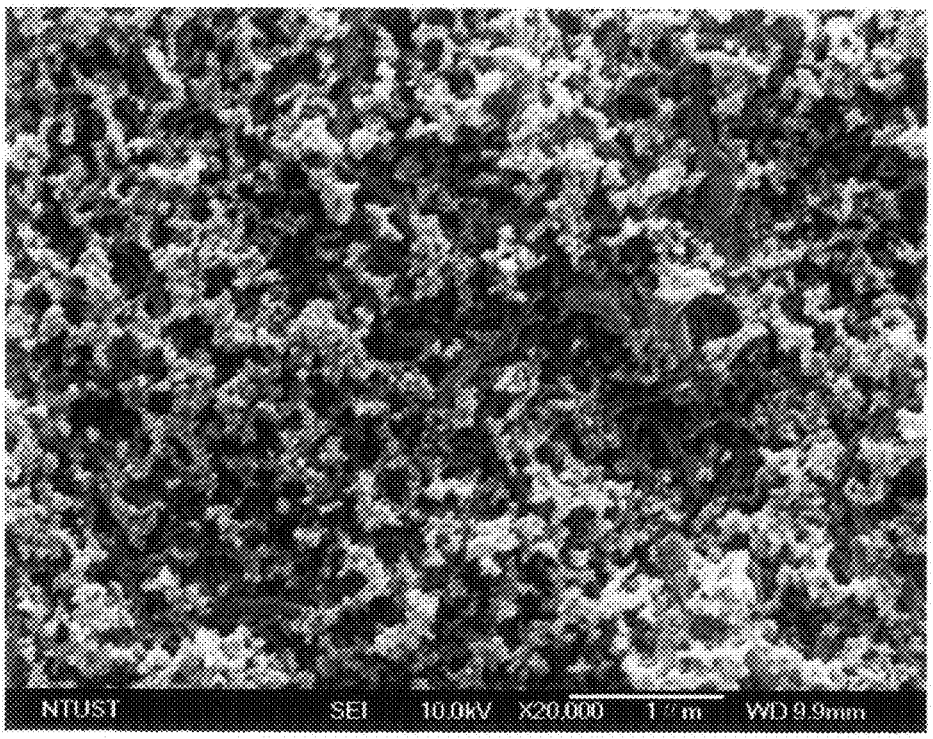
FIG. 9 shows the state of the film wherein the proportions of the semiconductor particles and PTFE are 20% and 80%.
Figure 10:
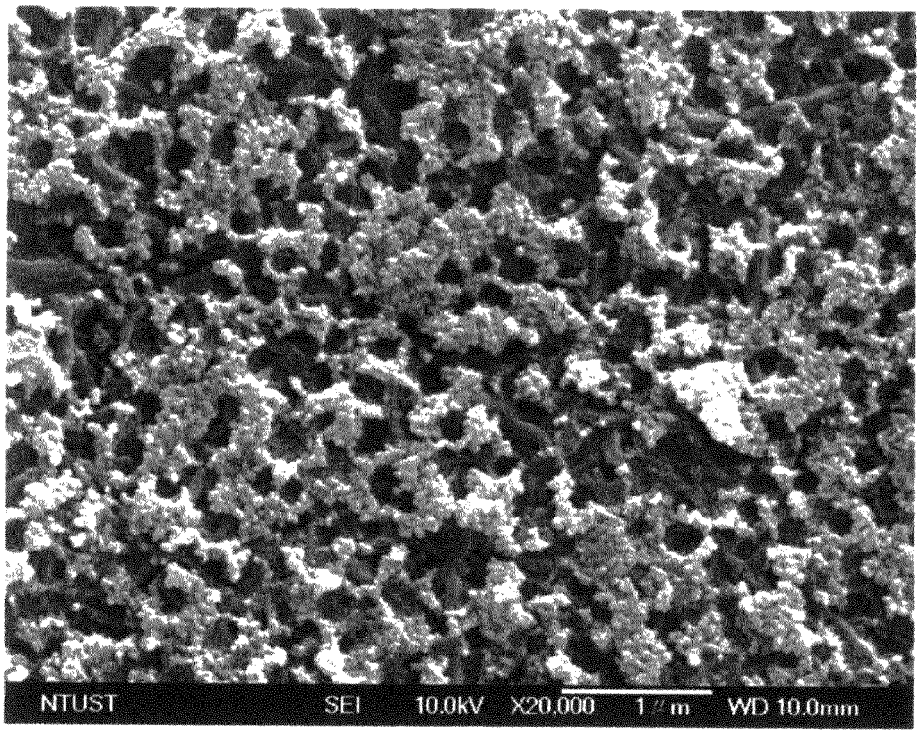
FIG. 10 shows the state of the film wherein the proportions of the semiconductor particles and PTFE are 25% and 75%.
Figure 11:
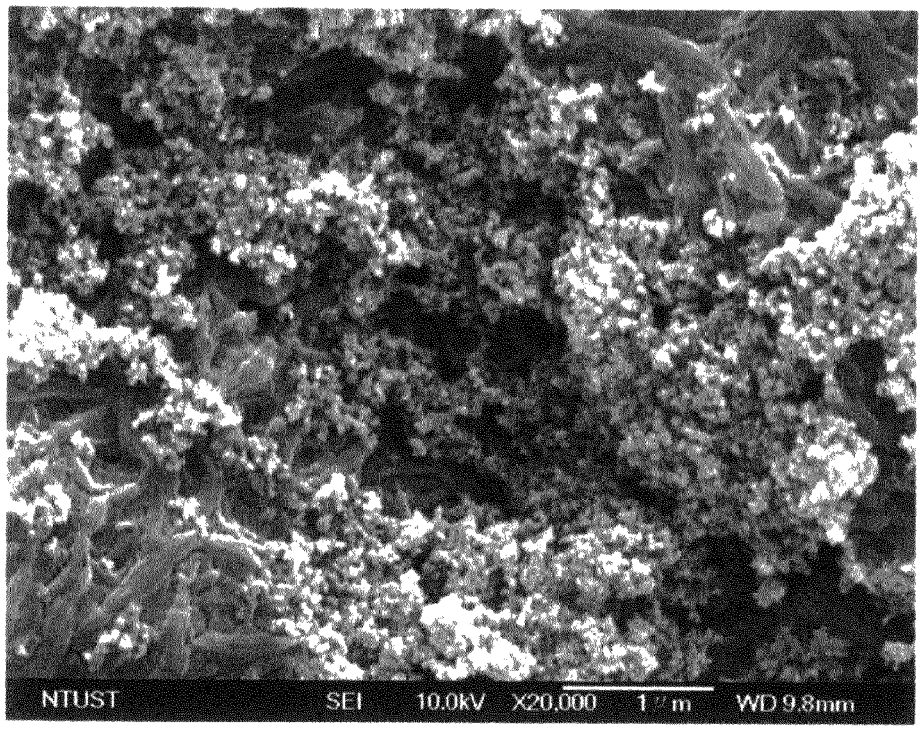
FIG. 11 shows the state of the film wherein the proportions of the semiconductor particles and PTFE are 30% and 70%.
Figure 12:
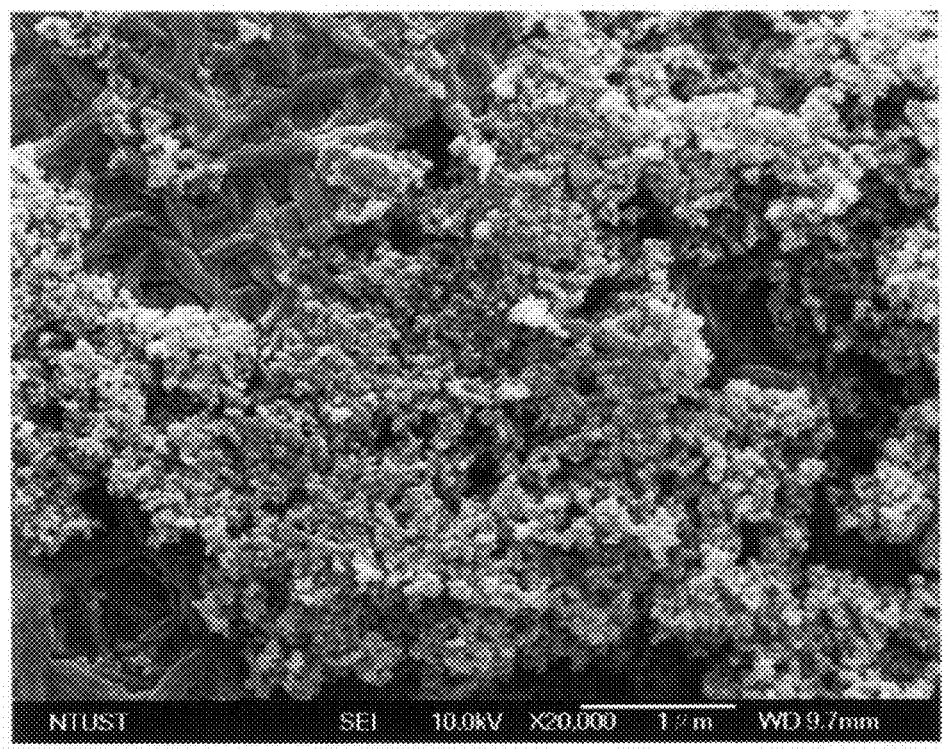
FIG. 12 shows the state of the film wherein the proportions of the semiconductor particles and PTFE are 40% and 60%.
Figure 13:
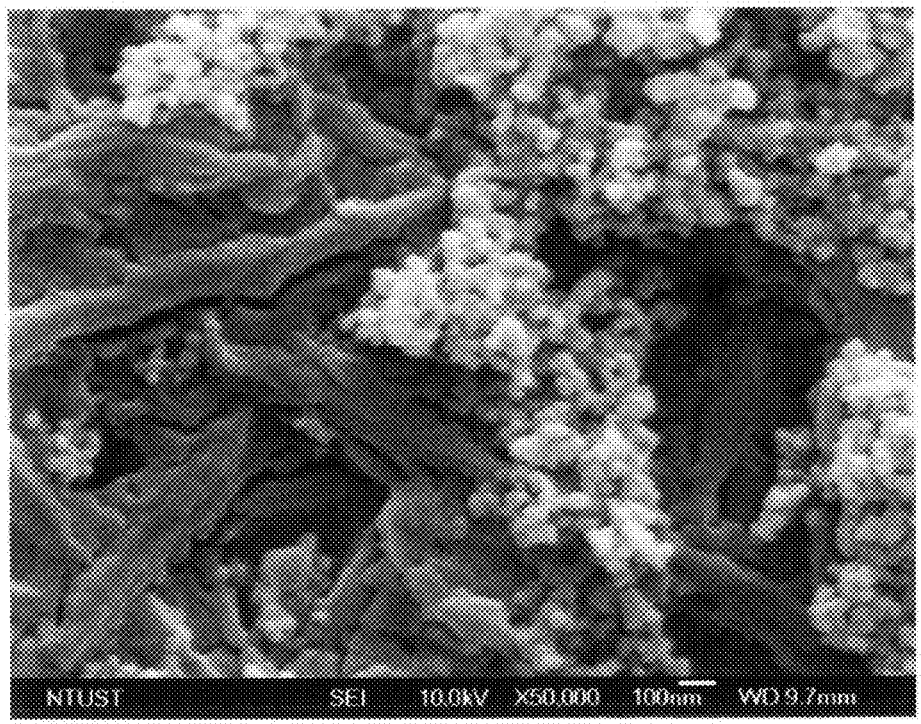
FIG. 13 shows the state of the film when the proportions of the semiconductor particles and PTFE are 40% and 60%, wherein the semiconductor particles almost cover the PTFE, but the PTFE skeleton is till visible.

When the proportions of the semiconductor particles and PTFE are 20% and 80%, the state of the film is as shown in FIG. 9. When the proportion of the semiconductor particles is increased to 25%, and the proportion of PTFE is 75%, the state of the film is as shown in FIG. 10. If the proportion of the semiconductor particles is increased to 30%, the state of the film is as shown in FIG. 11. If the proportion of the semiconductor particles is increased to 40%, the state of the film is as shown in FIG. 12. The semiconductor particles almost cover the PTFE, but the PTFE skeleton is till visible, as shown in FIG. 13. Furthermore, when the proportion of the semiconductor particles is increased to 50%, the photoelectric electrode has the best performance, as shown in FIG. 2.

When a multilayer processing is performed, the thickness of the PTFE can be easily controlled and increased. When the thickness of the photoelectric electrode is about 20 μm, the photoelectric electrode has better photoelectrical performance, as shown in FIG. 3.

When fabricating the photoelectric electrode of the present invention, as the film with a PTFE skeleton can be formed additionally, and adhered by using a semiconductor slurry, the thickness of the film and the processing can be easily controlled. The fabrication is more convenient and easier to be controlled, compared with the method of forming a film directly on a conductive glass. If required, additional processing on the film, such as modification or deposition, can be easily performed. As being flexible, the PTFE skeleton can be fabricated on a soft electrode by a convenient process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photoelectric electrode capable of absorbing light energy, comprising:
    at least a conductive substrate;
    at least a layer, comprising at least a semiconductor nano-particle and at least a polytetrafluoroethylene (PTFE); and
    at least a slurry layer, comprising at least a semiconductor nano-particle; and located between the conductive substrate and the layer, wherein the photoelectric electrode is immersed in a photosensitizing dye, so as to form the photoelectric electrode.

2. The photoelectric electrode capable of absorbing light energy according to claim 1, wherein the conductive substrate is composed of an inorganic or organic material.

3. The photoelectric electrode capable of absorbing light energy according to claim 1, wherein the semiconductor nano-particles in the slurry layer and the semiconductor nano-particles in the layer are the same.

4. The photoelectric electrode capable of absorbing light energy according to claim 1, wherein the photoelectric electrode is capable of absorbing full spectrum light energy.

5. The photoelectric electrode capable of absorbing light energy according to claim 1, wherein the semiconductor nano-particle is selected from among titanium dioxide, zinc oxide, tin oxide, iron oxide, tungsten oxide, silicon carbide, cadmium sulfide, cadmium selenide, gallium phosphide, gallium arsenide, C-60, cadmium telluride, copper indium gallium diselenide or copper indium, indium gallium, copper gallium, copper indium gallium, copper indium gallium selenium sulfide, and mixtures and modified mixtures thereof.

6. The photoelectric electrode capable of absorbing light energy according to claim 1, wherein the semiconductor nano-particle is selected from among titanium dioxide, zinc oxide, tin oxide, iron oxide, tungsten oxide, silicon carbide, cadmium sulfide, cadmium selenide, gallium phosphide, gallium arsenide, and mixtures and modified mixtures thereof, and the photoelectric electrode is sintered before the step of immersing the photoelectric electrode in a photosensitizing dye, wherein the photoelectric electrode is capable of absorbing full spectrum light energy.

7. The photoelectric electrode capable of absorbing light energy according to claim 1, wherein the conductive substrate is formed by coating a conductive layer on a substrate.

8. The photoelectric electrode capable of absorbing light energy according to claim 7, wherein the substrate is selected from rigid transparent materials including glass, glass fiber and glass fiber resin, or selected from transparent polymer materials including polyolefin, polyethylene (PE), polypropylene (PP), polyester, poly(ethylene terephthalate) (PET), poly-methylmethacrylate (PMMA), polycarbonate, and copolymers thereof.

9. The photoelectric electrode capable of absorbing light energy according to claim 1, wherein in the mixture of semiconductor nano-particles and PTFE, the content of the semiconductor nano-particles is 10 wt %-90 wt %.

10. The photoelectric electrode capable of absorbing light energy according to claim 1, wherein in the mixture of the semiconductor nano-particles and PTFE, the content of the semiconductor nano-particles is more than 50 wt %, and the photoelectric electrode further comprises a semiconductor slurry layer coated between the conductive substrate and the layer.

11. A method of fabricating a photoelectric electrode capable of absorbing light energy, comprising:
   providing a conductive substrate;
   disposing a semiconductor nano-particle slurry layer on the conductive substrate;
   combining at least a layer comprising at least a semiconductor nano-particle and at least a PTFE on the semiconductor nano-particle slurry layer; and
   immersing the fabricated photoelectric electrode into a photosensitizing dye, so as to form the photoelectric electrode.

12. The method of fabricating a photoelectric electrode capable of absorbing light energy according to claim 11, wherein the photoelectric electrode is capable of absorbing full spectrum light energy.

13. The method of fabricating a photoelectric electrode capable of absorbing light energy according to claim 11, further comprising:
   performing a multilayer processing on the conductive substrate, so as to form a multi-layered photoelectric electrode with a desired thickness.

14. The method of fabricating a photoelectric electrode capable of absorbing light energy according to claim 11, wherein the layer is formed by fabricating the mixture composed of semiconductor nano-particles and PTFE into a film by a film-forming method of spin coating, knife coating, spray coating, extruding, rolling, or die casting, and the step of combining at least a layer on the conductive substrate comprises sintering the semiconductor nano-particles precipitated from a surface of the layer on the conductive substrate.

15. The method of fabricating a photoelectric electrode capable of absorbing light energy according to claim 14, wherein the sintering temperature is 200° C.-700° C.

16. The photoelectric electrode capable of absorbing light energy according to claim 1, wherein the semiconductor nano-particles in the slurry layer and the semiconductor nano-particles in the layer are different.

* * * * *